US007848072B2

(12) United States Patent
Cordes et al.

(10) Patent No.: US 7,848,072 B2
(45) Date of Patent: Dec. 7, 2010

(54) FAULT DETECTION FOR BATTERY CHARGERS

(75) Inventors: Kevin Cordes, Miller Place, NY (US); Christopher R. Paul, Bayport, NY (US); Kenneth J. Rivalsi, Lake Grove, NY (US); Patrick Riechel, Briarwood, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 194 days.

(21) Appl. No.: 12/113,278

(22) Filed: May 1, 2008

(65) Prior Publication Data

US 2009/0273872 A1 Nov. 5, 2009

(51) Int. Cl.
*H02H 3/18* (2006.01)
(52) U.S. Cl. .................................. 361/93.1; 361/78
(58) Field of Classification Search .............. 361/78, 361/9, 90, 93.1, 93.17; 320/116, 134, 135
See application file for complete search history.

(56) References Cited

U.S. PATENT DOCUMENTS

| | | | | |
|---|---|---|---|---|
| 4,740,754 A | * | 4/1988 | Finger | 324/428 |
| 5,121,047 A | * | 6/1992 | Goedken et al. | 320/160 |
| 5,585,994 A | | 12/1996 | Tamai et al. | |
| 5,602,460 A | | 2/1997 | Fernandez et al. | |
| 5,654,622 A | * | 8/1997 | Toya et al. | 320/129 |
| 5,734,253 A | * | 3/1998 | Brake et al. | 320/125 |
| 6,239,581 B1 | | 5/2001 | Yoshida | |
| 6,377,429 B1 | * | 4/2002 | Descombes | 361/93.8 |
| 6,956,356 B2 | * | 10/2005 | Elder | 320/134 |
| 7,274,171 B2 | * | 9/2007 | Nishida et al. | 320/137 |
| 7,557,539 B2 | * | 7/2009 | Takagi et al. | 320/122 |
| 7,656,127 B1 | * | 2/2010 | Shutt et al. | 320/134 |
| 2006/0203410 A1 | * | 9/2006 | Kashine | 361/93.1 |

OTHER PUBLICATIONS

International Search Report and Written Opinion of the International Searching Authority for PCT/2009/042499 mailed Jun. 25, 2009.

* cited by examiner

*Primary Examiner*—Danny Nguyen

(57) ABSTRACT

A method of fault detection for battery chargers includes sensing a charge current applied to a battery with a resistive element. The method includes measuring a voltage across the resistive element. The method includes generating a trigger signal when the measured voltage across the resistive element exceeds a predetermined value. The method includes generating from the trigger signal an interrupt signal for a microprocessor. The method includes initiating an over-current handling routine in the microprocessor.

15 Claims, 2 Drawing Sheets

FAULT DETECTION FOR BATTERY CHARGERS

FIELD OF THE DISCLOSURE

The present disclosure relates generally to battery chargers.

BACKGROUND

Many battery chargers are controlled by microprocessors. These microprocessors may include battery charger handling routine or subprogram to provide special services if some anomalies happen to the battery chargers. In addition to handling battery charging anomalies, a microprocessor may need to share its processing power among many other functions, or among several battery chargers. The response time of the microprocessor for observing and providing service to the charging process of each battery charger may not be sufficient for certain critical anomalies in the charging process, such as, a very large surge in the charge current, which may cause significant damages in certain type of batteries if such critical anomaly is not handled promptly.

Accordingly, there is a need for a method and apparatus that can provide prompt services to certain critical anomalies in the battery charging process.

SUMMARY

In one aspect, the invention is directed to a method of fault detection for battery chargers. The method includes sensing a charge current applied to a battery with a resistive element. The method includes measuring a voltage across the resistive element. The method includes generating a trigger signal when the measured voltage across the resistive element exceeds a predetermined value. The method includes generating from the trigger signal an interrupt signal for a microprocessor. The method includes initiating an over-current handling routine in the microprocessor.

In another aspect, the invention is directed to a method of fault detection for battery chargers. The method includes sensing a charge current applied to a battery with a resistive element. The method includes measuring a voltage across the resistive element. The method includes generating a trigger signal when the measured voltage across the resistive element exceeds a predetermined value. The method includes coupling the trigger signal to a data bus that is configured to be polled by a microprocessor. The method includes initiating an over-current handling routine in the microprocessor.

Implementations of the invention can include one or more of the following advantages. The method and apparatus disclosed herein may provide prompt services to certain critical anomalies in the battery charging process. These and other advantages of the present invention will become apparent to those skilled in the art upon a reading of the following specification of the invention and a study of the several figures of the drawings.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
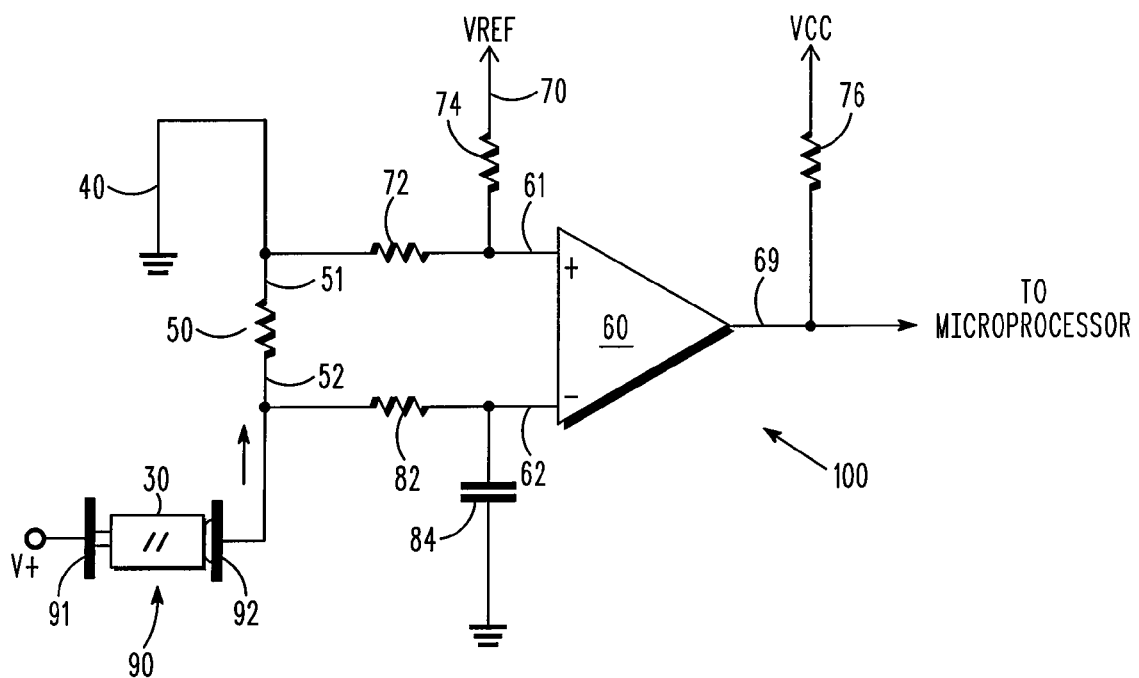
FIG. 1 shows a fault detection system for a battery charger.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

FIG. 1 shows a fault detection system for a battery charger. In FIG. 1, a fault detection system 100 includes a battery charging station 90, a resistive element 50, a comparator 60, and a microprocessor. The resistive element 50 is coupled to the battery charging station 90 for sensing a charge current generated by the battery charging station. In the implementation as show in FIG. 1, the battery charging station 90 having a first terminal 91 coupled to a power source and a second terminal 92 coupled to a common voltage 40 through the resistive element 50. A battery 30 can be charged by the charging station 90 by connecting the battery 30 with the two terminals 91 and 92. The comparator 60 has a first input 61 coupled through resistive element 72 to a first terminal 51 of the resistive element and has a second input 62 coupled to a second terminal 52 of the resistive element. The first input of the comparator 60 is also coupled through resistive element 74 to a reference voltage 70. The microprocessor has an interrupt input coupled to an output 69 of the comparator 60. The comparator 60 can be a Schmidt trigger, a differential amplifier (e.g., an instrumentation amplifier), or other kind of properly configured operational amplifiers.

In operation, the battery charging station 90 applies a voltage V+ to the battery 30. The charge current applied to the battery 30 passes through the resistive element 50. A voltage across the resistive element 50 is induced by the charge current. The voltage at the second input 62 of the comparator 60 is proportional to the charge current applied to the battery 30 averaged over some time period related to an RC constant as determined by the values of the resistor 82 and the capacitor 84. The voltage at the first input 61 of the comparator 60 is proportional to the reference voltage 70 and can be determined by the values of the resistors 72 and 74.

Under normal conditions, the voltage at the second input 62 of the comparator 60 is less than the voltage at the first input 61 of the comparator 60, and the voltage at the output 69 of the comparator 60 will remain at a high voltage value. When the voltage at the second input 62 of the comparator 60 exceeds the voltage at the first input 61 of the comparator 60, the voltage at the output 69 of the comparator 60 will change from a high voltage value to a low voltage value. Such a voltage transition can create a trigger signal for use as an interrupt signal for the microprocessor.

Once the microprocessor receives an interrupt signal, an interrupt service routine can be evoked. After determining which device and what condition created the interrupt, the microprocessor can evoke the corresponding service routine or subprogram to handle the service required by the device and the condition. For example, an interrupt created by the voltage transition at the output 69 of the comparator 60 generally indicates that there is a large surge in the charge current of the battery charging station 90 and such surge in the charge current needs to be handled promptly. The microprocessor now can act accordingly by evoking an over-current handling routine to provide proper services to the battery charging station 90. In one implementation of the over-current handling routine, the microprocessor can simply disable the power to the battery charging station 90 to prevent possible damages to the battery 30 by the large surge in the charge current.

In the implementation as shown in FIG. 1, the second terminal 52 of the resistive element 50 is coupled to the second input 62 of the comparator 60 through a low-pass filter that includes a resistor 82 and a capacitor 84. The high frequency noise at the second terminal 52 of the resistive element 50 is filtered out to prevent possible spurious trigger signals generated by the noise.

In the implementation as show in FIG. 1, the battery charging station 90 has a first terminal 91 coupled to a power source and a second terminal 92 coupled to a common voltage 40 through the resistive element 50. In other implementations, the battery charging station 90 can have a first terminal 91 coupled to a power source through the resistive element 50 and a second terminal 92 coupled to a common voltage 40.

In some implementations, the voltage transition at the output 69 of the comparator 60 can be used as an interrupt signal for the microprocessor. In other implementations, the voltage transition at the output 69 of the comparator 60 can be latched as a status bit and such status bit can be pulled through a GPIO bus by the microprocessor with a special high-duty-cycle IO monitoring subroutine. For some applications and on certain microprocessors, such IO monitoring subroutine can be running on a separate thread that is different from the thread running the main program.

Figure 2:
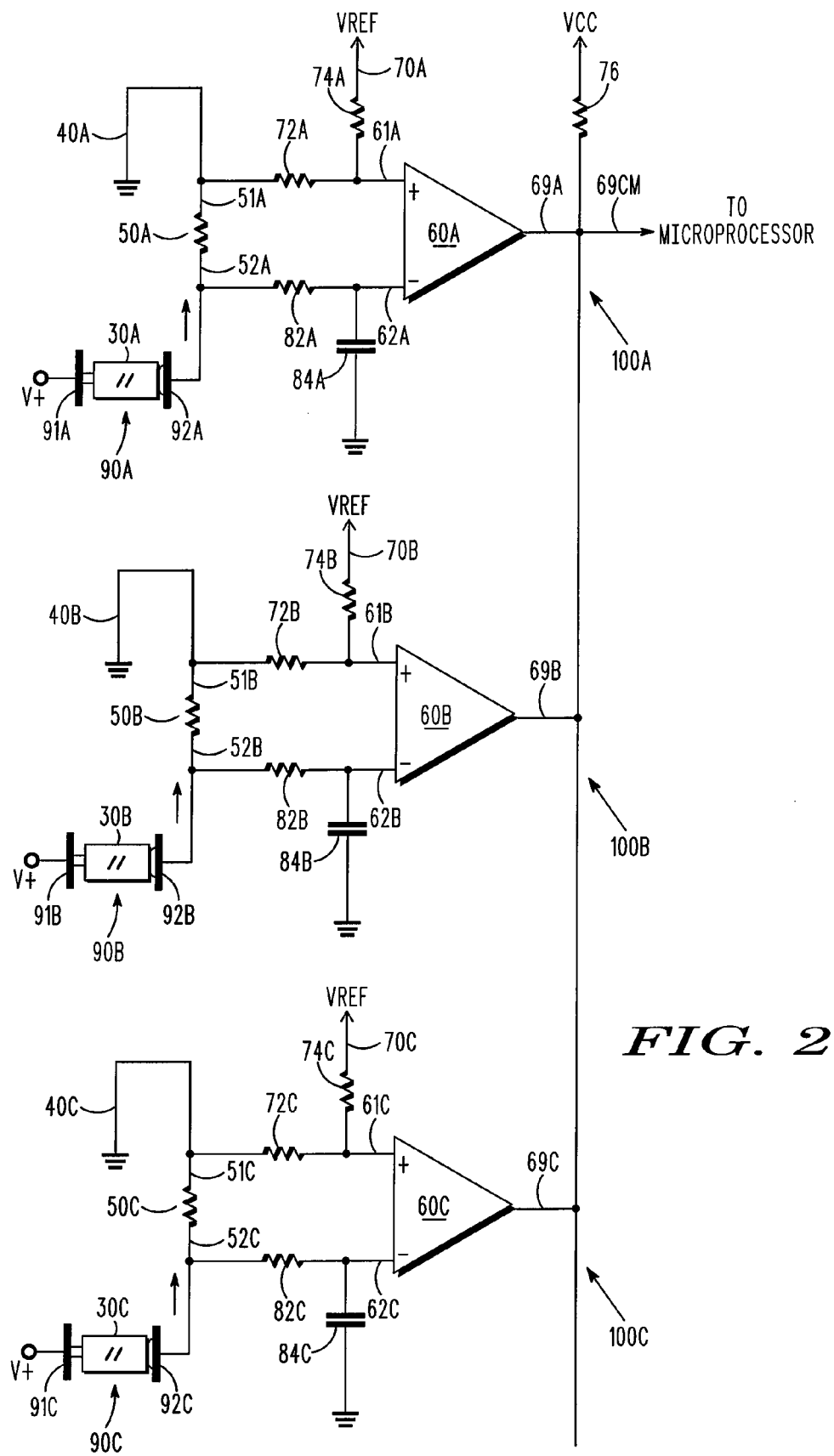
FIG. 2 shows a fault detection system for a battery charging system for charging multiple batteries.

FIG. 2 shows a fault detection system for a battery charging system for charging multiple batteries. In FIG. 2, the battery charging system includes a plurality of resistive elements (e.g., 50A, 50B, and 50C . . . ), a plurality of battery charging stations (e.g., 90A, 90B, and 90C . . . ), a plurality of comparators (e.g., 60A, 60B, and 60C . . . ), and a microprocessor. A battery charging station (e.g., 90B) has a terminal (e.g., 92B) coupled to a common voltage 40 through a resistive element (e.g., 50B). The battery charging station (e.g., 90B) has another terminal (e.g., 91B) coupled to a power source V+. A given comparator (e.g., 60B) is associated with a corresponding resistive element (e.g., 50B) selected from the plurality of resistive elements. The given comparator (e.g., 60B) has a first input (e.g., 61B) coupled to a first terminal (e.g., 51B) of the corresponding resistive element (e.g., 50B) and has a second input (e.g., 62B) coupled to a second terminal (e.g., 52B) of the corresponding resistive element (e.g., 50B). The first terminal of the given comparator (e.g., 60B) is coupled to a reference voltage 70.

In FIG. 2, each comparator (e.g., 60B) has an output (e.g., 69B) which generates a voltage transition when the voltage across the corresponding resistive element (e.g., 50B) exceeds certain threshold voltage. In one implementation, the output (e.g., 69B) of each comparator (e.g., 60B) can be coupled to an interrupt input of the microprocessor. In another implementation, the output (e.g., 69B) of each comparator (e.g., 60B) can be coupled to a data bus that is configured to be polled by the microprocessor. In certain specific implementations, when the output (e.g., 69B) of each comparator (e.g., 60B) is configured as an open collector output, the output (e.g., 69B) of the plurality of comparators (e.g., 60A, 60B, and 60C . . . ) can be connected together to form one common output 69CM. The voltage transition on this common output 69CM can be used as an interrupt signal and can be sent to the interrupt input of the microprocessor directly. Alternatively, the voltage transition on this common output 69CM can be latched as a status bit and such status bit can be polled through a GPIO bus by the microprocessor running a special high-speed IO monitoring subroutine.

Once the microprocessor is notified that there a faulty condition in at least one of the battery charging stations, the microprocessor can evoke the corresponding service routine or subprogram to handle this faulty condition. This service routine or subprogram can perform one of the following implemented functions. In a first implementation, the microprocessor can disable the power to all charging stations (i.e., 90A, 90B, and 90C). In a second implementation, the microprocessor can sequentially disable the power to only one charging station until the faulty one is found; the microprocessor then can disable the faulty one from operation and keep all other charging stations in operation condition. In a third implementation, the microprocessor can sequentially enable the power to only one charging station until the faulty one is found; the microprocessor then can disable the faulty one from operation and keep all other charging stations in operation condition.

The method and apparatus described above may have one of the following advantages. It may improve the safety level of battery chargers. It may protect certain kind of batteries from incidental damages during charging process. Additional advantages may be appreciated by people skilled the art.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
   a plurality of battery charging stations;
   a plurality of resistive elements wherein a resistive element is coupled to a battery charging station for sensing a charge current generated by the battery charging station;
   a plurality of comparators wherein a given comparator is associated with a corresponding resistive element selected from the plurality of resistive elements, the given comparator has a first input coupled to a first terminal of the corresponding resistive element and has a second input coupled to a second terminal of the corresponding resistive element, and wherein the first terminal of the given comparator is coupled to a reference voltage;
   a microprocessor having an interrupt input; and
   wherein the plurality of comparators includes multiple comparators each having an output coupled to the interrupt input of the microprocessor.

2. The apparatus of claim 1, wherein
   each comparator measures a voltage across a corresponding resistive element.

3. The apparatus of claim 1,
   further comprising a plurality of differential amplifiers for measuring a voltage across a corresponding plurality of resistive elements.

4. The apparatus of claim 1,
   further comprising a plurality of low pass filters for filtering a voltage across a corresponding plurality of resistive elements.

5. The apparatus of claim 1, wherein each resistive element senses a charge current generated by the battery charging station by
   passing the charge current through each resistive element in the plurality of resistive elements.

6. The apparatus of claim 1,
   wherein each battery charging station includes a first terminal coupled to a power source and a second terminal coupled to a common voltage through a corresponding resistive element.

7. The apparatus of claim 1,
   wherein each battery charging station includes a first terminal coupled to a power source through a corresponding resistive element and a second terminal coupled to a common voltage.

8. The apparatus of claim 1, wherein at least one of the plurality of comparators is a Schmidt trigger.

9. The apparatus of claim 1, wherein at least one of the plurality of comparators is a differential amplifier.

10. The apparatus of claim 1, further comprising:
    a plurality of capacitive elements, each capacitive element being coupled between the second input of a corresponding comparator and a common voltage.

11. The apparatus of claim 1, further comprising:
    a plurality of low-pass filters, each low-pass filter being coupled between the second terminal of a corresponding resistive element and the second input of a corresponding comparator.

12. An apparatus comprising:
    a plurality of battery charging stations;
    a plurality of resistive elements wherein a resistive element is coupled to a battery charging station for sensing a charge current generated by the battery charging station;
    a plurality of comparators wherein a given comparator is associated with a corresponding resistive element selected from the plurality of resistive elements, the given comparator has a first input coupled to a first terminal of the corresponding resistive element and has a second input coupled to a second terminal of the corresponding resistive element, and wherein the first terminal of the given comparator is coupled to a reference voltage;
    a microprocessor;
    a data bus that is configured to be polled by the microprocessor; and
    wherein the plurality of comparators includes multiple comparators each having an output coupled to the data bus.

13. The apparatus of claim 12, wherein
each comparator measures a voltage across a corresponding resistive element.

14. The apparatus of claim 12,
further comprising a plurality of low pass filters for filtering a voltage across a corresponding plurality of resistive elements.

15. The apparatus of claim 12, wherein each resistive element senses a charge current generated by the battery charging station by
passing the charge current through each resistive element in the plurality of resistive elements.

* * * * *